United States Patent
Garner et al.

(10) Patent No.: US 10,879,182 B2
(45) Date of Patent: Dec. 29, 2020

(54) ASSEMBLY SUBSTRATES INCLUDING THROUGH HOLE VIAS AND METHODS FOR MAKING SUCH

(71) Applicant: CORNING INCORPORATED, Corning, PA (US)

(72) Inventors: Sean Matthew Garner, Elmira, NY (US); Tian Huang, Painted Post, NY (US); Tammy Lynn Petriwsky, Elmira, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/618,673

(22) PCT Filed: May 31, 2018

(86) PCT No.: PCT/US2018/035498
§ 371 (c)(1),
(2) Date: Dec. 2, 2019

(87) PCT Pub. No.: WO2018/222940
PCT Pub. Date: Dec. 6, 2018

(65) Prior Publication Data
US 2020/0118931 A1 Apr. 16, 2020

Related U.S. Application Data

(60) Provisional application No. 62/513,718, filed on Jun. 1, 2017.

(51) Int. Cl.
*H01L 23/13* (2006.01)
*H01L 23/15* (2006.01)
*H01L 33/62* (2010.01)
*H01L 23/538* (2006.01)
*H01L 21/48* (2006.01)

(52) U.S. Cl.
CPC ........ *H01L 23/5384* (2013.01); *H01L 21/486* (2013.01); *H01L 23/13* (2013.01); *H01L 23/15* (2013.01); *H01L 23/5386* (2013.01); *H01L 33/62* (2013.01)

(58) Field of Classification Search
CPC ... H01L 23/5384; H01L 21/486; H01L 23/13; H01L 23/15; H01L 23/5386; H01L 33/62
USPC ......................................................... 174/264
See application file for complete search history.

(56) References Cited

U.S. PATENT DOCUMENTS 5,545,291 A * 8/1996 Smith ................... G02F 1/1362
257/E21.505
6,469,256 B1 * 10/2002 Miller ............... H01L 23/49822
174/255
(Continued)

OTHER PUBLICATIONS

International Search Report and Written Opinion of the International Searching Authority; PCT/US2018/035498; dated Sep. 18, 2018; 12 Pages; Korean Intellectual Property Office.

*Primary Examiner* — Timothy J Thompson
*Assistant Examiner* — Michael F Mcallister
(74) *Attorney, Agent, or Firm* — Gregory V. Bean; Ryan T. Hardee (57) ABSTRACT

Various embodiments are related to substrates having one or more well structures with a trapezoidal cylinder shaped through hole via extending from the bottom of the well structure though the substrate.

17 Claims, 6 Drawing Sheets

(56) References Cited

U.S. PATENT DOCUMENTS

| | | | |
|---|---|---|---|
| 7,560,803 B2* | 7/2009 | Onozawa | H01L 24/95 |
| | | | 257/656 |
| 9,755,110 B1* | 9/2017 | Crowder | H01L 27/156 |
| 9,837,390 B1* | 12/2017 | Sorensen | H05K 3/284 |
| 9,917,226 B1* | 3/2018 | Heine | H01L 33/32 |
| 10,062,674 B1* | 8/2018 | Ellison | C03B 17/02 |
| 10,535,640 B2* | 1/2020 | Lee | H01L 24/24 |
| 10,644,190 B2* | 5/2020 | Zhan | H01L 33/18 |
| 2004/0092105 A1 | 5/2004 | Lee et al. | |
| 2004/0223704 A1* | 11/2004 | Fujii | G02B 6/4201 |
| | | | 385/88 |
| 2005/0164485 A1* | 7/2005 | Onozawa | H01L 25/50 |
| | | | 438/616 |
| 2007/0029670 A1 | 2/2007 | Shibayama et al. | |
| 2010/0326716 A1* | 12/2010 | Zhang | H05K 1/024 |
| | | | 174/262 |
| 2011/0256344 A1 | 10/2011 | Ono et al. | |
| 2014/0341567 A1 | 11/2014 | Schweninger | |
| 2014/0355931 A1* | 12/2014 | Tummala | G02B 6/43 |
| | | | 385/14 |
| 2015/0060402 A1* | 3/2015 | Burkett | B23K 26/55 |
| | | | 216/41 |
| 2015/0155445 A1 | 6/2015 | Zhan et al. | |
| 2015/0214430 A1 | 7/2015 | Zhan et al. | |
| 2017/0108173 A1 | 4/2017 | Kim et al. | |
| 2017/0372927 A1* | 12/2017 | Schuele | H01L 24/95 |
| 2018/0012873 A1* | 1/2018 | Lee | H01L 24/24 |
| 2018/0144951 A1* | 5/2018 | Koelling | H01L 23/49827 |
| 2018/0342450 A1* | 11/2018 | Huang | H01L 23/15 |

* cited by examiner

ASSEMBLY SUBSTRATES INCLUDING THROUGH HOLE VIAS AND METHODS FOR MAKING SUCH

CROSS-REFERENCE TO RELATED APPLICATIONS

This application claims the benefit of priority under 35 U.S.C. § 371 of International Application No. PCT/US2018/035498, filed on May 31, 2018, which claims the benefit of priority of U.S. Provisional Application Ser. No. 62/513,718 filed on Jun. 1, 2017, the contents of each of which are relied upon and incorporated herein by reference in their entirety as if fully set forth below.

FIELD OF THE INVENTION

Various embodiments are related to substrates having one or more well structures with a trapezoidal cylinder shaped through hole via extending from the bottom of the well structure though the substrate.

BACKGROUND

LED displays, LED display components, and arrayed LED devices include a large number of diodes placed at defined locations across the surface of the display or device. Fluidic assembly may be used for assembling diodes in relation to a substrate. Such assembly is often a stochastic process whereby LED devices are deposited into wells on a substrate. One problem with such deposition of LED devices into wells is the propensity to dislodge from the wells as the flow of LED devices in a suspension passes over previously deposited devices. This can lead to an inability to sufficiently populate a display.

Hence, for at least the aforementioned reasons, there exists a need in the art for advanced systems and methods for manufacturing assembly substrates.

SUMMARY

Various embodiments are related to substrates having one or more well structures with a trapezoidal cylinder shaped through hole via extending from the bottom of the well structure though the substrate.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Various embodiments are related to substrates having one or more well structures with a trapezoidal cylinder shaped through hole via extending from the bottom of the well structure though the substrate.

Some embodiments provide assembly substrates that include a substrate and an assembly structure layer. The substrate has a first surface and a second surface, and the assembly structure layer is disposed over the first surface of the substrate. The assembly structure layer includes a plurality of openings that each expose a portion of the first surface of the substrate. At least one through-hole via extends from the second surface of the substrate to the first surface of the substrate where a first end of the through hole via is accessible at the first surface of the substrate and within one of the plurality of openings, and a second end of the through-hole via is accessible a the second surface of the substrate. A cross-sectional area parallel to the second surface of the substrate at the second end of the through-hole via is larger than a cross-sectional area parallel to the second surface of the substrate at the first end of the through-hole via.

In some instances of the aforementioned embodiments, the shape of the through-hole via is a trapezoidal cylinder. In various instances of the aforementioned embodiments, the plurality of openings includes at least a first subset each having a first shape and a second subset each having a second shape. In some such instances where the at least one through-hole via is a first through-hole via extending from an opening included in the first subset, the assembly substrate further includes a second through-hole via extending from an opening included in the second subset. The second through-hole via exhibits a different dimensional characteristic than that of the first through-hole via such as, for example, a different size and/or shape.

In various cases, the through-hole via is completely filled with an electrically conductive material. In other cases, the through-hole via is conformally filled with an electrically conductive material. In one or more cases, an electrical contact is formed in the bottom of the one of the plurality of openings near the first opening of the through-hole via, and an electrically conductive material is formed in the through-hole via such that it contacts the electrical contact.

In some instances of the aforementioned embodiments, the substrate is formed of glass. In some such embodiments, the substrate is formed of a first type of glass, and the assembly structure layer is formed of a second type of glass. In various instances of the aforementioned embodiments, the at least one through-hole via is a first through-hole via extending from one of the plurality of openings, and the assembly substrate further includes a second through-hole via extending from the first surface of the substrate to the second surface of the substrate. In such instances, the first through-hole via exhibits a trapezoidal cylinder shape and the second through-hole via exhibits a straight cylinder shape.

Other embodiments provide methods for forming an assembly substrate. The methods include: providing a substrate having a first surface and a second surface; forming at least one through-hole via extending from the second surface of the substrate to the first surface of the substrate; and forming an assembly structure layer over the first surface of the substrate. A first end of the through hole via is located at the first surface of the substrate and the second end of the through-hole via is located a the second surface of the substrate, and a cross-sectional area of the through-hole via at the second surface is larger than a cross-sectional area of the through-hole via at the second surface. The assembly structure layer includes at least one opening that exposes a portion of the first surface of the substrate where the first end of the through hole via is located.

In some instances of the aforementioned embodiments, the shape of the through-hole via is a trapezoidal cylinder. In various instances of the aforementioned embodiments, forming the at least one through-hole via includes: laser drilling the substrate at a location on the first surface of the substrate where the through-hole via is to be formed to form a hole extending through the substrate to the second surface of the substrate; masking the first surface of the substrate with an etch resistant material that covers an opening of the hole at the first surface of the substrate; and etching the substrate such that an opening of the hole at the second surface of the substrate is increased more than the opening of the hole a the first surface of the substrate. In some such instances, forming the at least one through-hole via further includes: removing the etch resistant material that covers the opening of the hole at the first surface of the substrate; and re-etching the substrate such that both the opening of the hole a the first surface of the substrate and the opening of the hole at the second surface of the substrate are increased.

In one or more instances of the aforementioned embodiments, the methods further include filling the through-hole via with an electrically conductive material. In some such instances, the methods include completely filling the through-hole via with the electrically conductive material. In other such instances, the methods include conformally coating the through-hole via with the electrically conductive material such that the through-hole via is only partially filled.

Figure 1A:
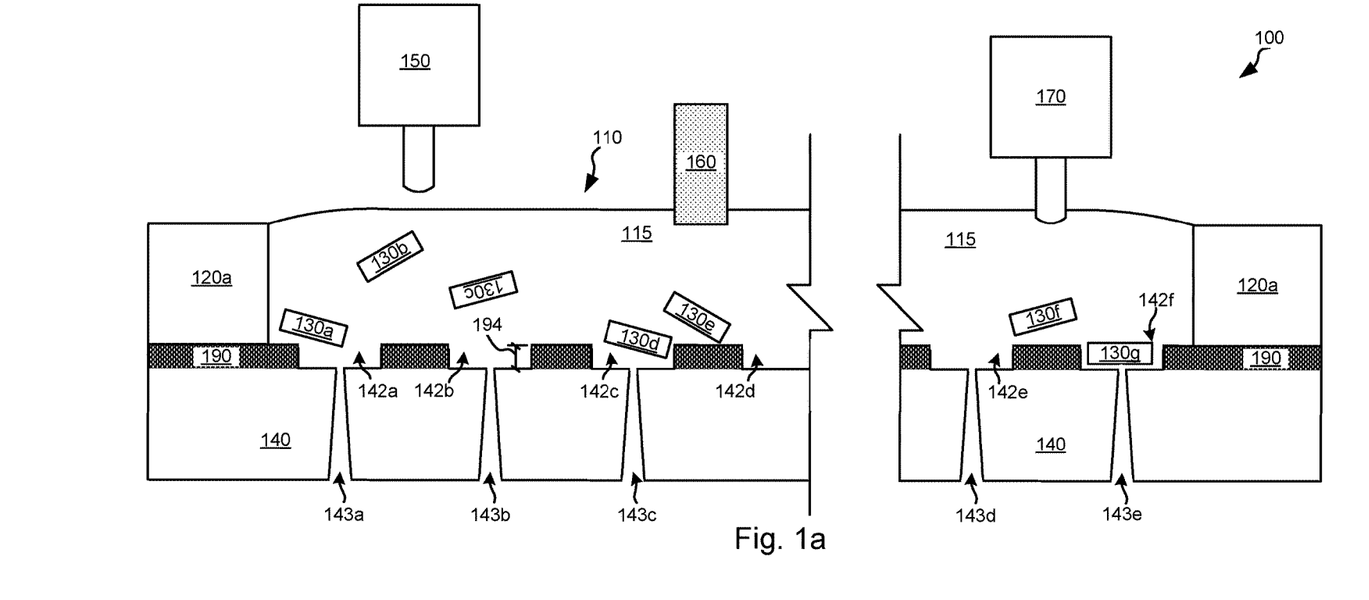
FIGS. 1a-1b depicts a fluidic assembly system capable of moving a suspension composed of a carrier liquid and a plurality of physical objects relative to an assembly substrate including a number of through hole vias extending from the bottom of wells through the substrate in accordance with one or more embodiments of the present inventions.

Turning to FIG. 1a, a fluidic assembly system 100 is shown that is capable of moving a suspension 110 composed of a carrier liquid 115 and a plurality of physical objects 130 relative to a assembly structure layer 190 atop a surface of a substrate 140 in accordance with one or more embodiments of the present inventions. Although the example discussed in relation to FIGS. 1a-1b focuses on fluidically placed physical objects, the substrate which includes assembly structure layer 190 can be used for other assembly methods as well. For example, the combination of substrate 140 and assembly structure layer 190 can be used for pick-n-place or other processes. The physical objects 130 may include, but are not limited to, electronic elements, diodes, micro light emitting diode (microLEDs), and/or other objects.

Assembly structure layer 190 may be formed using any process known in the art for forming fluidic structures over substrate 140. Forming assembly structure layer 190 may be done either before or after forming electronic circuitry on one or more of substrate 140 and assembly structure layer 190. In some cases, the combination of substrate 140 and assembly structure layer 190 may be rigid, and in other cases the combination may be flexible. As one example, a combination of substrate 140 and assembly structure layer 190 may be used which allows for fabricating large area fluidic assembly plates that can accommodate a large number of microLEDs each deposited into a respective one of wells 142 to form a display panel. Other examples where such a combination of substrate 140 and assembly structure layer 190 may be useful include, but are not limited to, large area lighting and signage, and radio frequency identification tags.

In some embodiments the material used to form substrate 140 is glass, and the material used to form assembly structure layer 190 is an inorganic material. Of course, other embodiments of the present inventions may use different material combinations or composites of material. For example, substrate 140 can also be a glass ceramic or ceramic material. Substrate 140 and layer 190 can be optically transparent, opaque, or translucent. In some cases, the combination of one or more materials used to form substrate 140 and assembly structure layer 190 is chosen to be mechanically compatible when exposed to processing temperatures of greater than six hundred degrees Celsius (600C). In other cases, the materials are compatible with various other processing temperatures. In some cases, the materials are compatible with processing temperatures greater than five hundred degrees Celsius (500C). In yet other cases, the materials are compatible with processing temperatures greater than four hundred degrees Celsius (400C). In yet further cases, the materials are compatible with processing temperatures greater than three hundred degrees Celsius (300C). Such processing temperatures accommodate, inter alia, thin film transistor fabrication, solder reflow, and eutectic bonding processes.

Figure 1B:
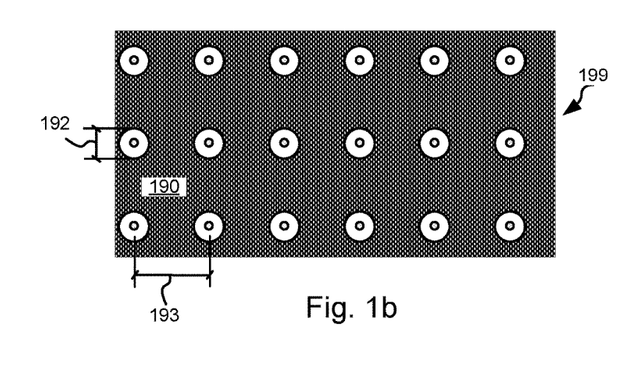

Turning to FIG. 1b, an example top view 199 of the surface of substrate 140 is shown with an array of wells 142 (shown as circles) extending into assembly structure layer 190, and each having an opening (shown as an inner circle) to a respective one of through-hole vias 143 extending from the bottom of the wells 142. Each of wells 142 has a diameter 192 and a depth 194. It should be noted that while wells 142 are shown as circular in cross-section, other shapes may be used in relation to different embodiments. For example, other shapes, such as, for example, square, trapezoid, or other arbitrary shapes may be supported using different embodiments of the present inventions. In various cases, diameter 192 is greater than five (5) micrometers. In yet other cases, diameter 192 is greater than ten (10) micrometers. In yet further cases, diameter 192 is greater than twenty (20) micrometers. In yet additional cases, diameter 192 is greater than thirty (30) micrometers. In one or more cases, depth 194 is greater than ten (10) nanometers. In yet other cases, depth 194 is greater than one hundred (100) nanometers. In yet further cases, depth 194 is greater than one (1) micrometers. In some particular embodiments, diameter 192 is forty (40) micrometers or more formed in assembly structure layer 190 at five hundred (500) micrometers offsets 193 or less, and depth 194 is greater than three (3) micrometers. In some cases, the thickness of assembly structure layer 190 (i.e., depth 194) is substantially equal to the height of physical objects 130. In other cases, the thickness of assembly structure layer 190 is greater than the thickness of physical objects 130 where wells 142 are to be formed entirely within assembly structure layer 190. In other cases, the thickness assembly structure layer 190 is less than the thickness of physical objects. Note that a variety of physical objects that vary in size, shape, thickness, and composition can be assembled onto a substrate that includes a assembly structure layer 190. An inlet opening of wells 142 is greater that the width of physical objects 130 such that only one physical object 130 deposits into any given well 142. It should be noted that while embodiments discuss depositing physical objects 130 into wells 142, that other devices or objects may be deposited in accordance with different embodiments of the present inventions. Further, it should be noted that in some particular applications, layer 190 may not be present and patterning of the surface features occurs directly in substrate 140.

Through-hole vias 143 are formed that extend from the bottom of wells 142 through substrate 140. Such through-hole vias 143 are trapezoidal-cylinders in shape with an opening at a bottom surface of substrate 140 being larger than an opening at the bottom of a respective well 142. Such through-hole vias 143 allow for application of a suction force to a bottom side of substrate 140 that operates to pull some of carrier liquid 115 through respective through-hole vias 143 until one of physical objects 130 is deposited in the well 142 from which the through-hole 143 via extends. With a physical object 130 deposited within the well 142, the suction force applied to the bottom side of substrate 130 operates to hold a deposited physical object 130 in place within the well 142.

A depositing device 150 deposits suspension 110 over the surface of fluidic assembly layer 190 and substrate 140 with suspension 110 held on top by sides 120 of a dam structure. In some embodiments, depositing device 150 is a pump with access to a reservoir of suspension 110. A suspension movement device 160 agitates suspension 110 deposited on substrate 140 such that physical objects 130 move relative to the surface of substrate 140. As physical objects 130 move relative to the surface of substrate 140 they deposit into wells 142. Again, as discussed earlier, a suction force applied to the bottom side of substrate 140 encourages such deposition of a physical object 130 into a well 142, and the same suction encourages a deposited physical object 130 to remain within the well 142. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump. As mentioned, alternative methods either including fluidic processes or in addition to fluidic processes can be used to locate the physical objects relative to the via. As just one additional method may use a pick-n-place method in addition to or in place of fluidic processes for locating physical objects relative to the via. In these examples, the physical object may not be deposited in the surface well structures themselves but located at other pre-defined coordinates relative to the vias.

A capture device 170 includes an inlet extending into suspension 110 and capable of recovering a portion of suspension 110 including a portion of carrier liquid 115 and non-deposited physical objects 130, and returning the recovered material for reuse. In some embodiments, capture device 170 is a pump. In some cases, the combination of substrate 140 and assembly structure layer 190 is formed similar to one of the embodiments discussed in more detail below in relation to FIGS. 3, 6, 6 and 8; and/or using one or more of the processes discussed below in relation to FIGS. 5, 7 and 9.

The combination of substrate 140 and assembly structure layer 190 may exhibit not only physical features such as wells 142 shown in fluidic assembly system 100, fluidic channels, or other physical surface structures, but also mechanical characteristics like the rigidity or flexibility discussed above, but also can be chosen or formed to exhibit specific optical properties. For example, in terms of optical properties, the combination of substrate 140 and inorganic assembly structure layer 190 can remain substantially transparent, have regions of being opaque to block or isolate light, have regions of a specific optical absorption, or have regions of controlled optical scattering. Patterning of the combination of substrate 140 and inorganic assembly structure layer 190 may occur on only a top surface as shown in fluidic assembly system 100, or on both a top and bottom surface. Two-dimensional shape of the physical features can be controlled using a proper photomask, and the vertical sidewall angle of the physical structures while shown in FIG. 1a as being purely vertical can be angled or otherwise shaped. The aforementioned patterning can be done using a wet etch, a plasma etch, ablation, or other patterning process or combination of patterning processes.

Figure 2A:
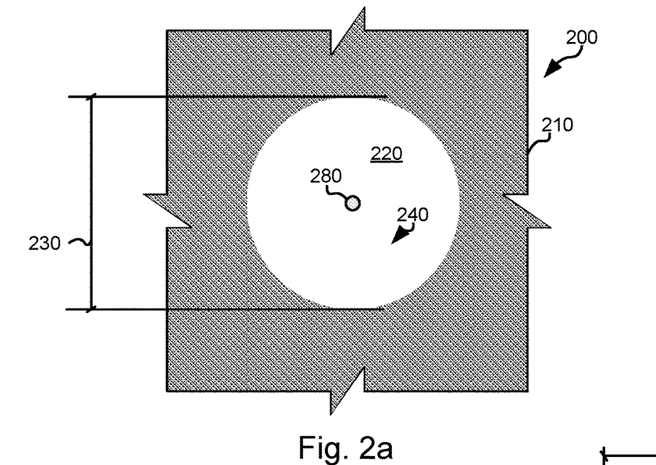
FIGS. 2a-2b depict a through hole via and well structure in accordance with some embodiments of the present inventions.
Figure 2B:
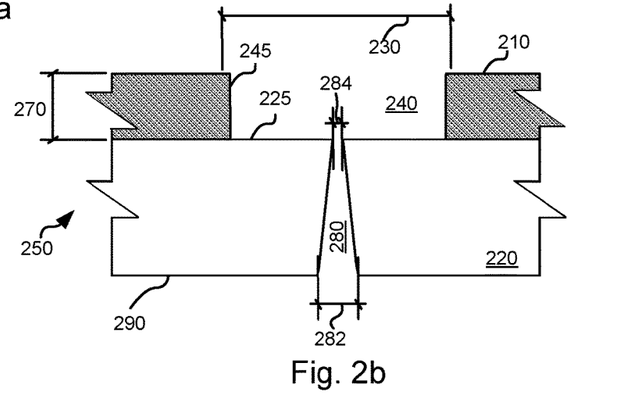

Turning to FIGS. 2a-2b, a top view 200 and a corresponding side view 250 of a portion of a assembly substrate including a well structure 240 and a corresponding through-hole via structure 280 is shown in accordance with some embodiments of the present inventions. As shown, well structure 240 extends into an assembly structure layer 210 to a top surface 225 of a substrate 220. Well structure 240 exhibits a width 230 and a depth 270. It should be noted that in some cases well structure 240 does not extend all the way through assembly structure layer 210 in which case top surface 225 of substrate 220 is not exposed at the bottom of well structure 240. A sidewall 245 of well structure 240 defines an outer perimeter of well 240.

As shown, through-hole via structure 280 is substantially shaped as a trapezoidal cylinder having a smaller opening (shown as a diameter 284) at top surface 225 of substrate 220 than a larger opening (shown as a diameter 284) at a bottom surface 290 of substrate 220. Such a trapezoidal cylinder shaped through-hole via may be manufactured, for example, by laser drilling through substrate 220 at locations where a through-hole via is to be formed. Such laser drilling results in a substantially straight cylinder opening extending through the substrate. The width of the opening is relatively small when compared with the width of the final through-hole via that is to be created. The side of the substrate to which the laser drilling was applied is then masked with an etch resistant film, and the substrate is etched with a first high Thiele modulus ($\Phi_1$) etch material for a first time period ($t_1$). By etching from only one side of the substrate, the substantially straight cylinder opening created by laser drilling opens more from one side of the opening than from the other resulting in a trapezoidal cylinder shaped opening. The etch resistant film is then removed from the substrate leaving both ends of the trapezoidal cylinder shaped opening exposed, and the substrate is etched again with a second high Thiele modulus ($\Phi_2$) etch material for a second time period ($t_2$). By etching the existing trapezoidal cylinder shaped opening from both ends, the size of the opening is increased, while maintaining the trapezoidal cylinder shaped.

It should be noted that through-hole vias of different size may be created by masking both sides of some of the trapezoidal cylinder shaped through-hole vias with an etch resistant film and etching the substrate again to further increase the size of a subset of the trapezoidal cylinder shaped through-hole vias. Further, some straight vias may be formed in the substrate by leaving a subset of laser drilled holes unmasked during the initial etching such that the shaped of the unmasked vias remains substantially a straight cylinder. Based upon the disclosure provided herein, one of ordinary skill in the art will recognize a variety of combinations of through hole via sizes and shapes that may be formed through the substrate in accordance with different embodiments. Also, multiple types of through hole sizes and shapes may exist on the same substrate. This can include combinations of both through-holes and blind vias.

Figure 3:
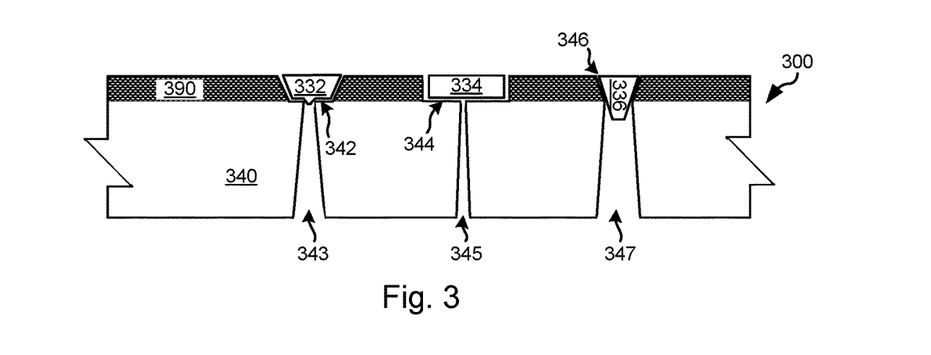
FIG. 3 shows a portion of an assembly substrate having multiple through hole via and well combinations each designed to accommodate physical objects of differing sizes and shapes in accordance with various embodiments of the present inventions.

Turning to FIG. 3, a portion of an assembly substrate 300 having multiple through hole via and well combinations is shown where each of the combinations is designed to accommodate physical objects of differing sizes and shapes in accordance with various embodiments of the present inventions. In particular, assembly substrate 300 includes an assembly structure layer 390 disposed over a substrate 340. Assembly structure layer 390 is shown with three distinct well structures 342, 344, 346 each extending to a top surface of substrate 340, and corresponding through-hole vias 343, 345, 347 extending through substrate 340. FIG. 3 shows multiple though hole via combinations in substrate 340. In addition, creation of blind vias in combination with through-holes is possible in the same substrate.

Well structure 346 is narrower than either well structure 344 or well structure 342 allowing for only the insertion of a smaller physical object 336 therein. Where a portion of either a physical object 332 or a physical object 334 is inserted into well structure 346, a substantial portion of the respective physical object will extend substantially above the top surface of assembly structure layer 390, and as such is exposed to the flow of material during fluidic assembly which is likely to cause it to dislodge from well 346. The sidewalls of well structure 346 are substantially tapered when compared with the sidewalls of well structure 344 such that physical object 336 is encouraged to deposit into well structure 346 in the shown orientation. As shown, physical object 336 inserts partially into through-hole via 347 which enlarged in width compared with through-hole via 343 and through-hole via 345. Such an enlargement of through-hole via 345 may be achieved by application of additional etching to substrate 340 while through-hole vias 343, 345 are covered by an etch resistant film. With a portion of physical object 336 inserted into through-hole via 347, physical object 336 is likely to remain fixed in well structure 346 during ongoing fluidic assembly. The stability of physical object 336 within well structure 346 is reinforced where a suction force is applied near a bottom surface of substrate 340. In any orientation other than that shown in FIG. 3, physical object 336 is much less likely to remain lodged in well structure 346 during ongoing fluidic assembly.

Well structure 342 is narrower than well structure 344, but wider than well structure 346 allowing for the insertion of either a physical object 332 or physical object 336 therein, but not of a physical object 334. However, as through-hole via 343 is narrower than through-hole via 347 such that the smaller physical object 336 cannot insert into through-hole via 343. Without insertion into through-hole via 343, the height of physical object extends substantially above a top surface of assembly structure layer 390, and as such is exposed to the flow of material during fluidic assembly which is likely to cause it to dislodge from well 342. In contrast, physical object 332 includes a small extension area capable of insertion into through-hole via 343 when properly inserted into well structure 342. With a portion of physical object 332 inserted into through-hole via 343, physical object 332 is likely to remain fixed in well structure 342 during ongoing fluidic assembly. The stability of physical object 332 within well structure 342 is reinforced where a suction force is applied near a bottom surface of substrate 340. In any orientation other than that shown in FIG. 3, physical object 332 is much less likely to remain lodged in well structure 342 during ongoing fluidic assembly.

Well structure 344 is wide enough to allow for insertion of any physical object 332, physical object 334, or physical object 336 therein. However, the overall height of both physcial object 332 and physical object 336 would result in a substantial portion of the respective physical object will extend substantially above the top surface of assembly structure layer 390 when deposited into well structure 344, and as such is exposed to the flow of material during fluidic assembly which is likely to cause it to dislodge from well 344. This is particularly true where through-hole via 345 is substantially smaller than through-hole via 343 such that the extension on physical object 332 that is designed to insert into through-hole via 343 is too large to insert substantially into through-hole via 345. Again, the small size of through-hole via 345 can be achieved by covering through-hole via 345 with an etch resistant film while substrate 340 is exposed to etching that increases the size of one or both of through-hole via 343 and through-hole via 347 relative to through-hole via 345. In contrast to insertion of physical object 332 or physical object 336 into well structure 344, when inserted into well structure 344 physical object 334 does not extend appreciably above the top surface of assembly structure layer 390, and the sidewalls of physical object 334 are substantially vertical which match the sidewalls of well structure 344. The combination of the aforementioned factors tend to cause physical object 334 to remain in well structure 344 during ongoing fluidic assembly. The stability of physical object 334 within well structure 344 is reinforced where a suction force is applied near a bottom surface of substrate 340.

Figure 4:
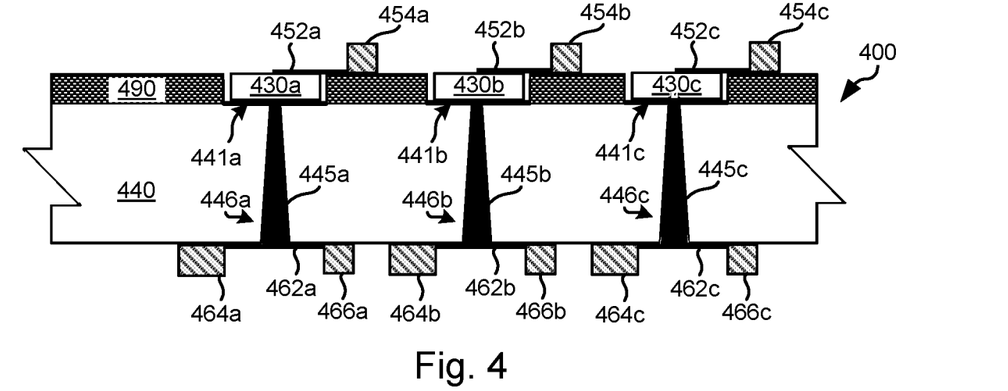
FIG. 4 depicts a portion of an assembly substrate having multiple through hole via and well combinations that are each of the same size and shape where electrical contacts have been formed by filling the through hole vias with an electrically conductive material in accordance with one or more embodiments of the present inventions.

Turning to FIG. 4, a portion of an assembly substrate 400 having multiple through hole via 446 and well 441 combinations is shown where each of the combinations is of the same size and shape, and where through hole vias 446 are filled with an electrically conductive material 445 in accordance with one or more embodiments of the present inventions. As shown, assembly substrate 400 includes an assembly structure layer 490 disposed over a substrate 440. Assembly structure layer 490 is shown with three identical well structures 441 each extending to a top surface of substrate 440, and corresponding through-hole vias 446 extending through substrate 440.

Wells 441 are formed of a shape and size that allow only a single one of physical objects 430 to deposit in a given well 441. A bottom electrical contact is formed in the bottom of each of wells 441 prior to deposition of physical objects 430 into respective wells 441. The formation of such bottom electrical contacts in the bottom of wells 441 may be done either before or after the formation of assembly structure layer 490 over substrate 440. During the deposition of physical objects 430 into respective wells 441, through-hole vias 446 are open allowing for a suction force to be applied to a bottom side of assembly substrate 400 to aid in capturing physical objects 430 within wells 441. Once physical objects 430 are in place in wells 441, a top electrical contact 452 is connected from a top of each of physical objects 430 to a respective connectivity structure 454 disposed over assembly structure layer 490. In addition, through-hole vias 446 are filled with an electrically conductive material 445 and a bottom substrate electrical contact 462 connects electrically conductive material 445 within through-hole vias 446 to respective connectivity structures 464, 466 disposed under assembly substrate 400.

Figure 5:
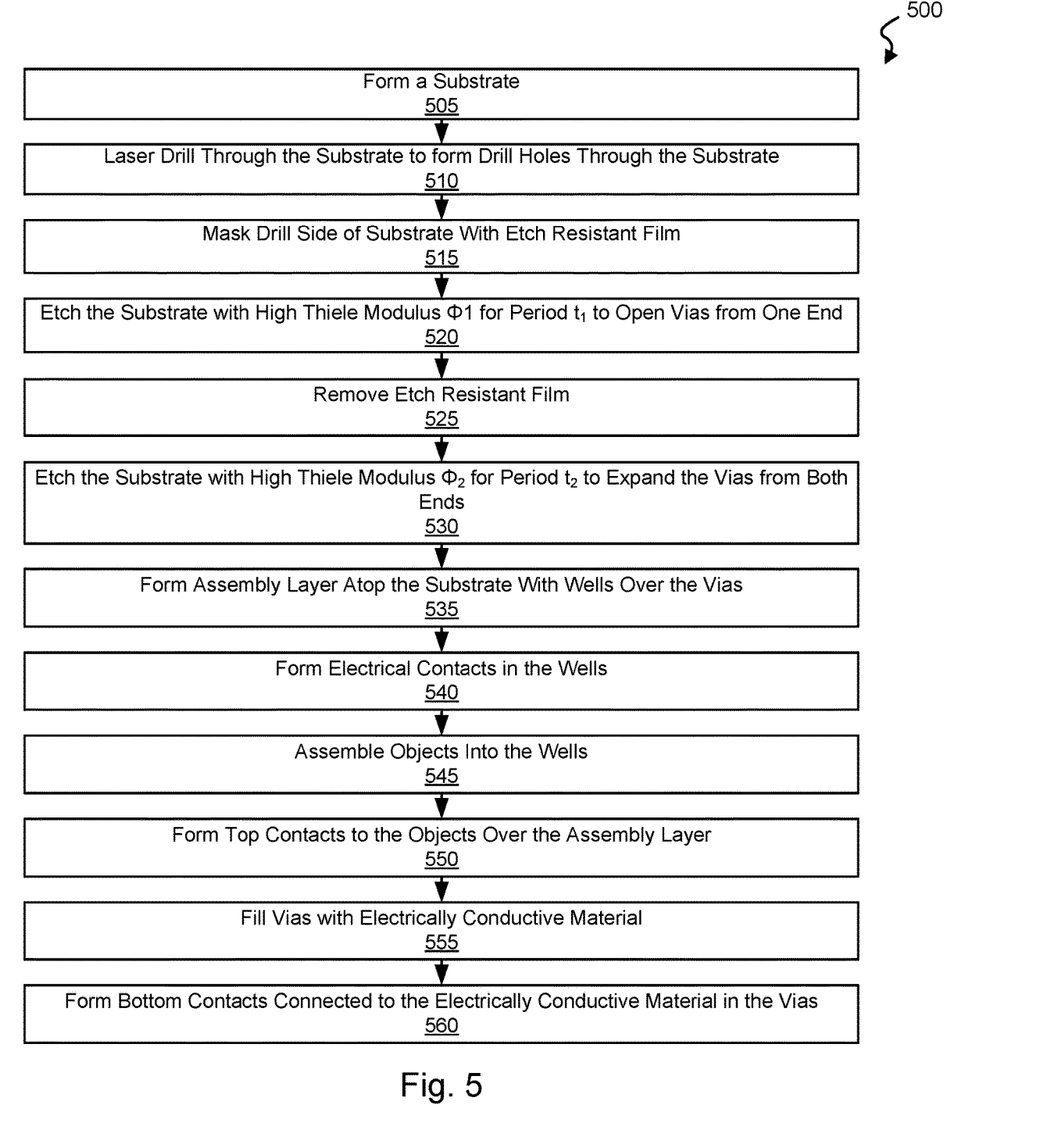
FIG. 5 is a flow diagram showing a method in accordance with some embodiments of the present inventions for manufacturing an assembly substrate similar to that depicted in FIG. 6.

Turning to FIG. 5, a flow diagram 500 shows a method in accordance with some embodiments of the present inventions for manufacturing an assembly substrate similar to that depicted in FIG. 4 above. Following flow diagram 500, a substrate 440 is formed (block 505). In some cases substrate 440 may be a transparent glass substrate. In one particular embodiment, the transparent glass substrate is a Corning Eagle XG® slim glass substrate formed using processes known in the art. In particular cases, the transparent glass substrate is seven hundred (700) microns thick. Based upon the disclosure provided herein, one of ordinary skill in the art will recognize other substrate materials and thicknesses that may be used in relation to different embodiments of the present inventions.

Laser drilling is performed on substrate 440 at locations where a through-hole via 446 is to be formed (block 510). Such laser drilling results in a substantially straight cylinder opening extending through the substrate. The width of the opening is relatively small when compared with the width of the final through-hole via that is to be created. The side of the substrate to which the laser drilling was applied is masked with an etch resistant film (block 515). Alternatively, the side opposite to which the laser drilling was applied is masked. Substrate 440 is then etched with a first high Thiele modulus ($\Phi_1$) etch material for a first time period ($t_1$) (block 520). By etching from only one side of substrate 440, the substantially straight cylinder opening created by laser drilling opens more from one side of the opening than from the other resulting in a trapezoidal cylinder shaped opening. The etch resistant film is then removed from substrate 440 leaving both ends of the trapezoidal cylinder shaped opening exposed (block 525). At this juncture, substrate 440 is then etched with a second high Thiele modulus ($\Phi_2$) etch material for a second time period ($t_2$) (block 530). By etching the existing trapezoidal cylinder shaped opening from both ends, the size of the opening is increased, while maintaining the trapezoidal cylinder shaped. At this juncture, through hole vias 446 in substrate 440 have been completed and can be used for electronic device fabrication without proceeding further in the process to block 535.

An assembly structure layer 490 is formed over the substrate (block 535). Assembly structure layer 490 includes wells 441 formed therein that are located above at least a subset of through-hole vias 446. This assembly structure layer may be formed using any combination of layer formation followed by masking and etch to define the wells, or may be formed by an additive process where a pattern is formed at locations where wells are to exist followed by formation of the assembly structure layer around the pattern, and subsequently by removal of the pattern leaving the open wells in assembly structure layer 490. Based upon the disclosure provided herein, one of ordinary skill in the art will recognize a variety of approaches for forming the assembly structure layer.

Electrical contacts are formed in the bottom of wells 441 that will act as bottom contacts for physical objects 430 deposited into wells 441 of assembly structure layer 490 (block 540). Any process known in the art for depositing or forming an electrically conductive material in the bottom of wells 441 may be used. Physical objects 430 are assembled into wells 441 (block 545). This assembly may be done using any process including, but not limited to, the fluidic assembly discussed above in relation to FIGS. 1a-1b. In some cases, a suction force is applied to the bottom of substrate 440 to encourage proper deposition of physical objects 430 into wells 441.

Top contacts 452 are formed connecting a top side of each of physical objects 430 to respective connectivity structures 454 (block 550). Any process known in the art for depositing or forming an electrically conductive material over physical objects 430 and assembly structure may be used. In addition, through-hole vias 446 are filled with an electrically conductive material 445 (block 555), and bottom contacts 462 are formed to electrically connect a bottom side of physical objects 430 to respective connectivity structures 464, 466 (block 560). In this case, filling the through-hole vias blocked on the top surface is a blind via filling procedure. Any process known in the art for filling through-hole vias 446 are filled with an electrically conductive material 445 and/or for depositing or forming an electrically conductive material substrate 440 to form bottom contacts 462 may be used.

Figure 6:
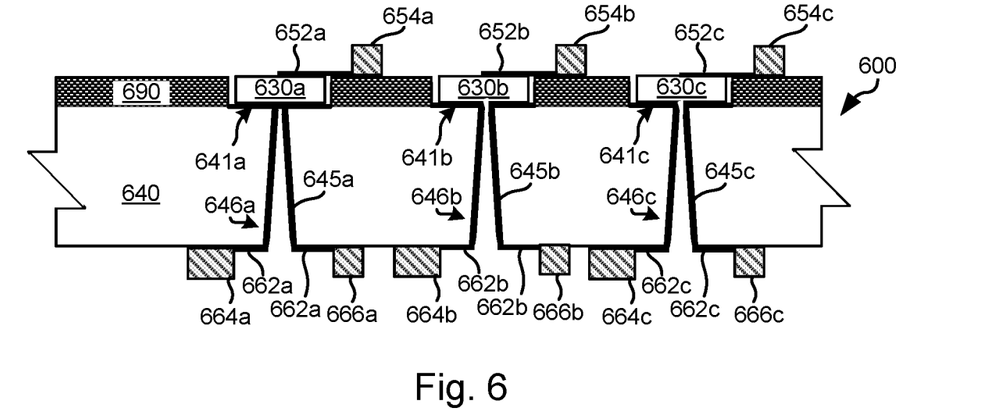
FIG. 6 depicts a portion of an assembly substrate having multiple through hole via and well combinations that are each of the same size and shape where electrical contacts have been formed by conformally coating the through hole vias with an electrically conductive material in accordance with one or more embodiments of the present inventions.

Turning to FIG. 6, a portion of an assembly substrate 600 having multiple through hole via 646 and well 641 combinations is shown where each of the combinations is of the same size and shape, and where through hole vias 646 are conformally coated with an electrically conductive material 645 in accordance with one or more embodiments of the present inventions. As shown, assembly substrate 600 includes an assembly structure layer 690 disposed over a substrate 640. Assembly structure layer 690 is shown with three identical well structures 641 each extending to a top surface of substrate 640, and corresponding through-hole vias 646 extending through substrate 640.

Wells 641 are formed of a shape and size that allow only a single one of physical objects 630 to deposit in a given well 641. A bottom electrical contact is formed in the bottom of each of wells 641 prior to deposition of physical objects 630 into respective wells 641. The formation of such bottom electrical contacts in the bottom of wells 641 may be done either before or after the formation of assembly structure layer 690 over substrate 640. During the deposition of physical objects 630 into respective wells 641, through-hole vias 646 are open allowing for a suction force to be applied to a bottom side of assembly substrate 600 to aid in capturing physical objects 630 within wells 641. Once physical objects 630 are in place in wells 641, a top electrical contact 652 is connected from a top of each of physical objects 630 to a respective connectivity structure 654 disposed over assembly structure layer 690. In addition, through-hole vias 646 are conformally coated with an electrically conductive material 645 and a bottom substrate electrical contact 662 connects electrically conductive material 645 along the walls of through-hole vias 646 to respective connectivity structures 664, 666 disposed under assembly substrate 600.

Figure 7:
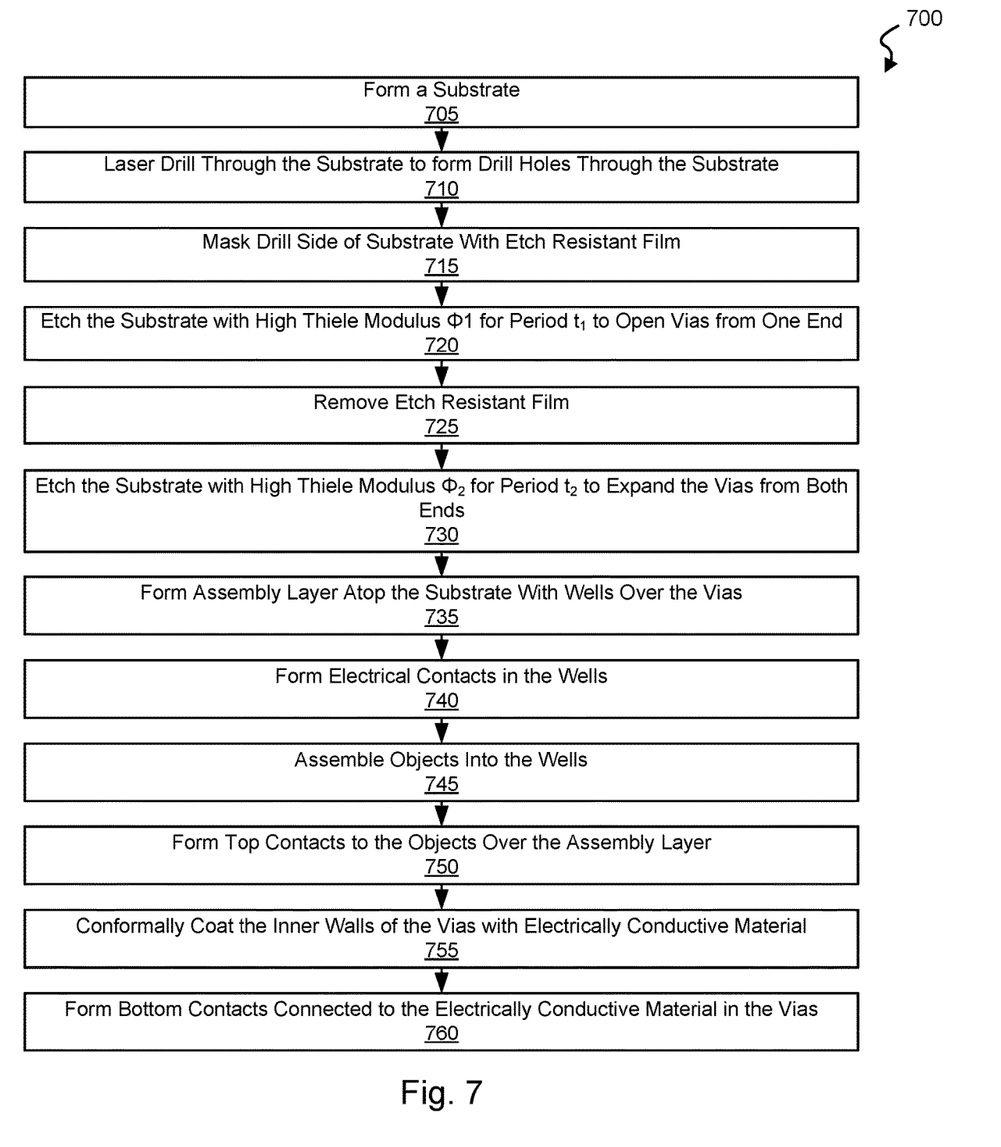
FIG. 7 is a flow diagram showing a method in accordance with some embodiments of the present inventions for manufacturing an assembly substrate similar to that depicted in FIG. 6.

Turning to FIG. 7, a flow diagram 700 shows a method in accordance with some embodiments of the present inventions for manufacturing an assembly substrate similar to that depicted in FIG. 6 above. Following flow diagram 700, a substrate 640 is formed (block 705). In some cases substrate 640 may be a transparent glass substrate. In one particular embodiment, the transparent glass substrate is a Corning Eagle XG® slim glass substrate formed using processes known in the art. In particular cases, the transparent glass substrate is seven hundred (700) microns thick. Based upon the disclosure provided herein, one of ordinary skill in the art will recognize other substrate materials and thicknesses that may be used in relation to different embodiments of the present inventions.

Laser drilling is performed on substrate 640 at locations where a through-hole via 646 is to be formed (block 710). Such laser drilling results in a substantially straight cylinder opening extending through substrate 640. The width of the opening is relatively small when compared with the width of the final through-hole via that is to be created. The side of substrate 640 to which the laser drilling was applied is masked with an etch resistant film (block 715). Alternatively, the side opposite to which the laser drilling was applied is masked. Substrate 640 is then etched with a first high Thiele modulus ($\Phi_1$) etch material for a first time period ($t_1$) (block 720). By etching from only one side of substrate 640, the substantially straight cylinder opening created by laser drilling opens more from one side of the opening than from the other resulting in a trapezoidal cylinder shaped opening. The etch resistant film is then removed from substrate 640 leaving both ends of the trapezoidal cylinder shaped opening exposed (block 725). At this juncture, substrate 640 is then etched with a second high Thiele modulus ($\Phi_2$) etch material for a second time period ($t_2$) (block 730). By etching the existing trapezoidal cylinder shaped opening from both ends, the size of the opening is increased, while maintaining the trapezoidal cylinder shaped. At this juncture, through hole vias 646 in substrate 640 have been completed and can be used for electronic device fabrication without proceeding further in the process to block 735.

An assembly structure layer 690 is formed over substrate 640 (block 735). Assembly structure layer 690 includes wells 641 formed therein that are located above at least a subset of through-hole vias 646. This assembly structure layer may be formed using any combination of layer formation followed by masking and etch to define the wells, or may be formed by an additive process where a pattern is formed at locations where wells are to exist followed by formation of the assembly structure layer around the pattern, and subsequently by removal of the pattern leaving the open wells in assembly structure layer 690. Based upon the disclosure provided herein, one of ordinary skill in the art will recognize a variety of approaches for forming the assembly structure layer.

Electrical contacts are formed in the bottom of wells 641 that will act as bottom contacts for physical objects 630 deposited into wells 641 of assembly structure layer 690 (block 740). Any process known in the art for depositing or forming an electrically conductive material in the bottom of wells 641 may be used. Physical objects 630 are assembled into wells 641 (block 745). This assembly may be done using any process including, but not limited to, the fluidic assembly discussed above in relation to FIGS. 1a-1b. In some cases, a suction force is applied to the bottom of substrate 640 to encourage proper deposition of physical objects 630 into wells 641.

Top contacts 652 are formed connecting a top side of each of physical objects 630 to respective connectivity structures 654 (block 750). Any process known in the art for depositing or forming an electrically conductive material over physical objects 630 and assembly structure may be used. In addition, through-hole vias 646 are filled with an electrically conductive material 645 (block 755), and bottom contacts 662 are formed to electrically connect a bottom side of physical objects 630 to respective connectivity structures 664, 666 (block 760). In this case, filling the through-hole vias blocked on the top surface is a blind via filling procedure. Any process known in the art for filling through-hole vias 646 are filled with an electrically conductive material 645 and/or for depositing or forming an electrically conductive material substrate 640 to form bottom contacts 662 may be used.

Figure 8:
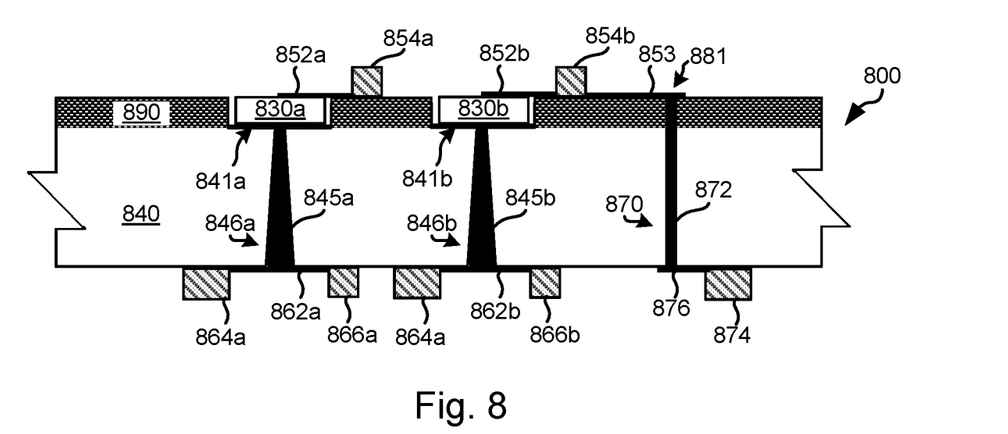
FIG. 8 depicts a portion of an assembly substrate having multiple through hole via and well combinations each having a trapezoidal through hole via extending from a well, and additionally a straight through hole via that may be used for electrical connectivity in accordance with various embodiments of the present inventions.

Turning to FIG. 8, a portion of an assembly substrate 800 having multiple through hole via 846 and well 841 combinations is shown where some of the combinations are of different shapes and/or sizes. As shown, assembly substrate 800 is shown with trapezoidal cylinder shaped through vias 846 extending form at least a subset of wells 841 in an assembly structure layer 890 disposed over a substrate 840; and at least one straight cylinder shaped through-hole via 870 extending from a top surface of assembly structure layer 890 to a bottom surface of substrate 840.

Wells 841 are formed of a shape and size that allow only a single one of physical objects 830 to deposit in a given well 841. A bottom electrical contact is formed in the bottom of each of wells 841 prior to deposition of physical objects 830 into respective wells 841. The formation of such bottom electrical contacts in the bottom of wells 841 may be done either before or after the formation of assembly structure layer 890 over substrate 840. During the deposition of physical objects 830 into respective wells 841, through-hole vias 846 are open allowing for a suction force to be applied to a bottom side of assembly substrate 800 to aid in capturing physical objects 830 within wells 841. Once physical objects 830 are in place in wells 841, a top electrical contact 852 is connected from a top of each of physical objects 830 to a respective connectivity structure 854 disposed over assembly structure layer 890. In addition, through-hole vias 846 are filled with an electrically conductive material 845 and a bottom substrate electrical contact 862 connects electrically conductive material 845 within through-hole vias 846 to respective connectivity structures 864, 866 disposed under assembly substrate 800. In addition, through-hole via 870 is filled with an electrically conductive material 872, an upper contact 853 connects electrically conductive material 872 to connectivity structure 854*b*, and a lower contact 876 connects electrically conductive material 872 to connectivity structure 874.

Figure 9:
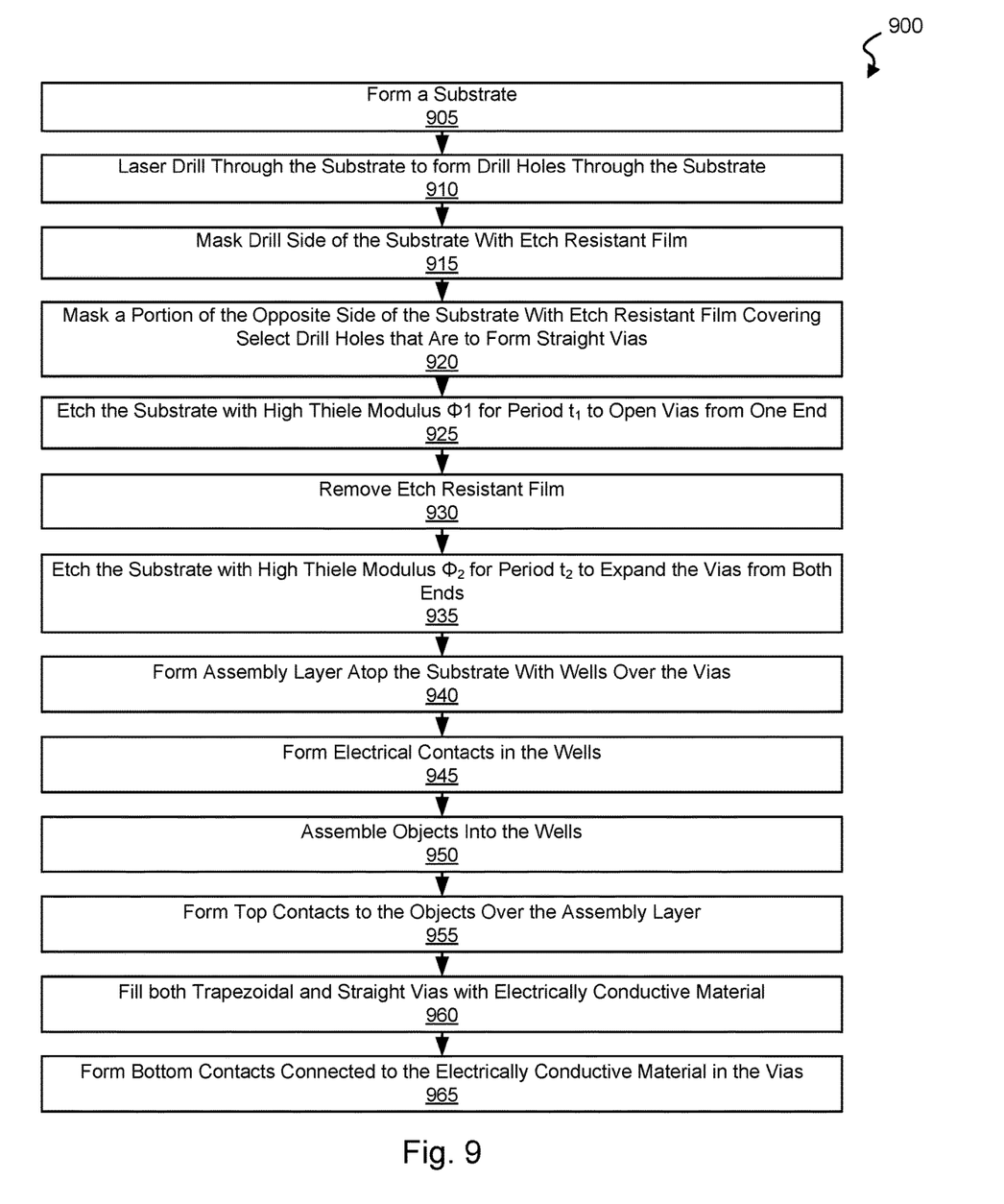
FIG. 9 is a flow diagram showing a method in accordance with some embodiments of the present inventions for manufacturing an assembly substrate similar to that depicted in FIG. 8.

Turning to FIG. 9, a flow diagram 900 shows a method in accordance with some embodiments of the present inventions for manufacturing an assembly substrate similar to that depicted in FIG. 8 above. Following flow diagram 900, a substrate 840 is formed (block 905). In some cases substrate 840 may be a transparent glass substrate. In one particular embodiment, the transparent glass substrate is a Corning Eagle XG® glass substrate formed using processes known in the art. In particular cases, the transparent glass substrate is seven hundred (700) microns thick. Based upon the disclosure provided herein, one of ordinary skill in the art will recognize other substrate materials and thicknesses that may be used in relation to different embodiments of the present inventions.

Laser drilling is performed on substrate 840 at locations where through-hole vias 846 and through-hole via 870 are to be formed (block 910). Such laser drilling results in a substantially straight cylinder opening extending through the substrate. The width of the opening is relatively small when compared with the width of the final through-hole via that is to be created. The side of the substrate to which the laser drilling was applied is masked with an etch resistant film for the locations of both through-hole vias 846 and through-hole via 870 (block 915), and a portion of the opposite side of substrate 840 is masked to cover locations corresponding to through-hole via 870 (block 920). Alternatively, the side opposite to which the laser drilling was applied is masked.

Substrate 840 is then etched with a first high Thiele modulus ($\Phi_1$) etch material for a first time period ($t_1$) (block 925). By etching from only one side of substrate 840, the substantially straight cylinder opening created by laser drilling at locations corresponding to through-hole vias 846 opens more from one side of the opening than from the other resulting in a trapezoidal cylinder shaped opening. The etch resistant film is then removed from substrate 840 leaving both ends of the trapezoidal cylinder shaped opening exposed, and both ends of the laser drilled hole corresponding to through-hole via 870 (block 930). At this juncture, substrate 840 is then etched with a second high Thiele modulus ($\Phi_2$) etch material for a second time period ($t_2$) (block 935). By etching the existing trapezoidal cylinder shaped openings at the locations corresponding to through-hole vias 846 from both ends, the size of the opening is increased, while maintaining the trapezoidal cylinder shaped. Similarly, by etching the existing straight laser drilled opening at the locations corresponding to through-hole via 870 from both ends, the size of the opening is increased, while maintaining the straight cylinder shape. At this juncture, through hole vias 846 in substrate 840 have been completed and can be used for electronic device fabrication without proceeding further in the process to block 940.

An assembly structure layer 890 is formed over the substrate (block 940). Assembly structure layer 890 includes wells 841 formed therein that are located above at least a subset of through-hole vias 846, and a narrower well 881 operating as an extension of through-hole via 870. This assembly structure layer may be formed using any combination of layer formation followed by masking and etch to define the wells, or may be formed by an additive process where a pattern is formed at locations where wells are to exist followed by formation of the assembly structure layer around the pattern, and subsequently by removal of the pattern leaving the open wells in assembly structure layer 890. Based upon the disclosure provided herein, one of ordinary skill in the art will recognize a variety of approaches for forming the assembly structure layer.

Electrical contacts are formed in the bottom of wells 841 that will act as bottom contacts for physical objects 830 deposited into wells 841 of assembly structure layer 890 (block 945). Any process known in the art for depositing or forming an electrically conductive material in the bottom of wells 841 may be used. Physical objects 830 are assembled into wells 841 (block 950). This assembly may be done using any process including, but not limited to, the fluidic assembly discussed above in relation to FIGS. 1*a*-1*b*. In some cases, a suction force is applied to the bottom of substrate 840 to encourage proper deposition of physical objects 830 into wells 841.

Top contacts 852 and top contacts 853 are formed connecting a top side of each of physical objects 830 to respective connectivity structures 854 (block 955). Any process known in the art for depositing or forming an electrically conductive material over physical objects 830 and assembly structure may be used. In addition, through-hole vias 846 are filled with an electrically conductive material 845 and through-hole via 870 is filled with an electrically conductive material 872 (block 960), and bottom contacts 862, 876 are formed to electrically connect a bottom side of physical objects 830 to respective connectivity structures 864, 866 and electrically conductive material 872 to connectivity structure 874 (block 960). Any process known in the art for filling through-hole vias 846 and through-hole via 870 filled with electrically conductive materials may be used.

In conclusion, the invention provides novel systems, devices, methods and arrangements for forming structures within a substrate. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An assembly substrate, the assembly substrate comprising:
    a substrate having a first surface and a second surface;
    an assembly structure layer disposed over the first surface of the substrate, wherein the assembly structure layer includes a plurality of openings that each expose a portion of the first surface of the substrate; and
    wherein at least one through-hole via extends from the second surface of the substrate to the first surface of the substrate, wherein a first end of the through hole via is accessible at the first surface of the substrate and within one of the plurality of openings, wherein a second end of the through-hole via is accessible a the second surface of the substrate, and wherein a cross-sectional area parallel to the second surface of the substrate at the second end of the through-hole via is larger than a cross-sectional area parallel to the second surface of the substrate at the first end of the through-hole via,
    wherein the plurality of openings includes at least a first subset each having a first shape and a second subset each having a second shape.

2. The assembly substrate of claim 1, wherein the shape of the through-hole via is a trapezoidal cylinder.

3. The assembly substrate of claim 1, wherein the at least one through-hole via is a first through-hole via extending from an opening included in the first subset, and wherein the assembly substrate further includes a second through-hole via extending from an opening included in the second subset, wherein the second through-hole via exhibits a different dimensional characteristic than that of the first through-hole via; and wherein the different dimensional characteristic is selected from a group consisting of: size, and shape.

4. The assembly substrate of claim 1, wherein the through-hole via is completely filled with an electrically conductive material.

5. The assembly substrate of claim 1, wherein the through-hole via is conformally filled with an electrically conductive material.

6. The assembly substrate of claim 1, wherein an electrical contact is formed in the bottom of the one of the plurality of openings near the first opening of the through-hole via, and wherein an electrically conductive material is formed in the through-hole via such that it contacts the electrical contact.

7. The assembly substrate of claim 1, wherein the substrate is formed of glass.

8. The assembly substrate of claim 7, wherein the glass is a first type of glass, and wherein the assembly structure layer is formed of a second type of glass.

9. The assembly substrate of claim 1, wherein the at least one through-hole via is a first through-hole via extending from one of the plurality of openings, and wherein the assembly substrate further includes a second through-hole via extending from the first surface of the substrate to the second surface of the substrate, wherein the first through-hole via exhibits a trapezoidal cylinder shape and the second through-hole via exhibits a straight cylinder shape.

10. A method for forming an assembly substrate, the method comprising:
   providing a substrate having a first surface and a second surface;
   forming at least one through-hole via extending from the second surface of the substrate to the first surface of the substrate, wherein a first end of the through hole via is located at the first surface of the substrate and the second end of the through-hole via is located at the second surface of the substrate, and wherein a cross-sectional area of the through-hole via at the second surface is larger than a cross-sectional area of the through-hole via at the first surface;
   forming an assembly structure layer over the first surface of the substrate, wherein the assembly structure layer includes at least one opening that exposes a portion of the first surface of the substrate where the first end of the through hole via is located; and
   filling the through-hole via with an electrically conductive material.

11. The method of claim 10, wherein the shape of the through-hole via is a trapezoidal cylinder.

12. The method of claim 10, wherein forming the at least one through-hole via includes:
   laser drilling the substrate at a location on the first surface of the substrate where the through-hole via is to be formed to form a hole extending through the substrate to the second surface of the substrate;
   masking the first surface of the substrate with an etch resistant material that covers an opening of the hole at the first surface of the substrate; and
   etching the substrate such that an opening of the hole at the second surface of the substrate is increased more than the opening of the hole at the first surface of the substrate.

13. The method of claim 12, wherein forming the at least one through-hole via further includes:
   removing the etch resistant material that covers the opening of the hole at the first surface of the substrate; and
   re-etching the substrate such that both the opening of the hole at the first surface of the substrate and the opening of the hole at the second surface of the substrate are increased.

14. The method of claim 10, wherein filling the through-hole via includes completely filling the through-hole via with the electrically conductive material.

15. The method of claim 10, wherein filling the through-hole via includes conformally coating the through-hole via with the electrically conductive material such that the through-hole via is only partially filled.

16. An assembly substrate, the assembly substrate comprising:
   a substrate having a first surface and a second surface;
   an assembly structure layer disposed over the first surface of the substrate, wherein the assembly structure layer includes a plurality of openings that each expose a portion of the first surface of the substrate; and
   a plurality of through-hole vias each extending from a first opening at the first surface of the substrate within a respective one of the plurality of openings to a second opening at the second surface of the substrate, wherein the second opening of each of the plurality of through-hole vias is larger than the first opening of each of the through-hole vias,
   wherein the plurality of openings includes at least a first subset each having a first shape and a second subset each having a second shape.

17. The assembly substrate of claim 16, wherein the at least one through-hole via is a first through-hole via extending from an opening included in the first subset, and wherein the assembly substrate further includes a second through-hole via extending from an opening included in the second subset, wherein the second through-hole via exhibits a different dimensional characteristic than that of the first through-hole via; and wherein the different dimensional characteristic is selected from a group consisting of: size, and shape.

* * * * *

UNITED STATES PATENT AND TRADEMARK OFFICE
CERTIFICATE OF CORRECTION

PATENT NO. : 10,879,182 B2
APPLICATION NO. : 16/618673
DATED : December 29, 2020
INVENTOR(S) : Sean Matthew Garner et al.

Page 1 of 1

It is certified that error appears in the above-identified patent and that said Letters Patent is hereby corrected as shown below:

In the Claims

Column 14, Line 57, Claim 1, delete "a the" and insert -- at the --, therefor.

Signed and Sealed this
Sixth Day of July, 2021

Drew Hirshfeld
*Performing the Functions and Duties of the
Under Secretary of Commerce for Intellectual Property and
Director of the United States Patent and Trademark Office*